US012625517B2

(12) United States Patent
Bondi et al.

(10) Patent No.: US 12,625,517 B2
(45) Date of Patent: May 12, 2026

(54) CLAMSHELL HOUSING FOR HUMAN-MACHINE INTERFACE (HMI)

(71) Applicant: Covestro LLC, Pittsburgh, PA (US)

(72) Inventors: Mark Bondi, Venetia, PA (US); Anthony Immormino, Pittsburgh, PA (US); Joel Matsco, Coraopolis, PA (US)

(73) Assignee: Covestro LLC, Pittsburgh, PA (US)

( * ) Notice: Subject to any disclaimer, the term of this patent is extended or adjusted under 35 U.S.C. 154(b) by 0 days.

(21) Appl. No.: 19/123,595

(22) PCT Filed: Oct. 4, 2023

(86) PCT No.: PCT/US2023/075934
§ 371 (c)(1),
(2) Date: Apr. 23, 2025

(87) PCT Pub. No.: WO2024/091778
PCT Pub. Date: May 2, 2024

(65) Prior Publication Data

US 2026/0010198 A1 Jan. 8, 2026

Related U.S. Application Data

(60) Provisional application No. 63/420,130, filed on Oct. 28, 2022.

(30) Foreign Application Priority Data

Nov. 28, 2022 (EP) .................................... 22209775

(51) Int. Cl.
*G06F 1/16* (2006.01)
*H05K 9/00* (2006.01)
(Continued)

(52) U.S. Cl.
CPC .......... *G06F 1/1629* (2025.01); *G06F 1/1656* (2013.01); *H05K 9/0007* (2013.01);
(Continued)

(58) Field of Classification Search
CPC .... G06F 1/1613; G06F 1/1633; G06F 1/1656; G06F 1/1658; G06F 1/166; G06F 1/183
(Continued)

(56) References Cited

U.S. PATENT DOCUMENTS 2,991,273 A 7/1961 Wilhelm et al.
2,999,835 A 9/1961 Goldberg
(Continued)

FOREIGN PATENT DOCUMENTS

DE 2036052 A 1/1972
DE 3832396 A 2/1990
(Continued)

OTHER PUBLICATIONS

D. Freitag, U. Grigo, P.R. Müller, H. Nouvertné, BAYER AG, “Polycarbonates” in Encyclopedia of Polymer Science and Engineering, vol. 11, Second Edition, 1988, pp. 648-718.
(Continued)

*Primary Examiner* — Adrian S Wilson
(74) *Attorney, Agent, or Firm* — John E. Mrozinski, Jr.; Richard P. Bender

(57) ABSTRACT

Provided is a clamshell housing for a human-machine interface comprising a plastic “C” cover assembly and a plastic “D” cover assembly, the plastic “C” cover assembly comprising a plastic keyboard cover or palm rest, having a plurality of snap fittings thereon for attachment to a plastic “D” cover assembly, a keyboard having a keyboard connector electrically connecting the keyboard to a printed circuit board (PCB), a trackpad having a trackpad connector electrically connecting the trackpad to the printed circuit board
(Continued)

(PCB). The housing of the invention may be easily disassembled for repair or recycling.

13 Claims, 6 Drawing Sheets

(51) Int. Cl.
*B29B 9/06* (2006.01)
*B29B 17/04* (2006.01)
*B29K 105/26* (2006.01)

(52) U.S. Cl.
CPC ............. *B29B 9/06* (2013.01); *B29B 17/0412* (2013.01); *B29B 2017/0496* (2013.01); *B29K 2105/26* (2013.01)

(58) Field of Classification Search
USPC ..................................................... 361/679.55
See application file for complete search history.

(56) References Cited

U.S. PATENT DOCUMENTS

| | | | | |
|---|---|---|---|---|
| 2,999,846 | A | 9/1961 | Hermann et al. | |
| 3,148,172 | A | 9/1964 | Fox | |
| 3,271,367 | A | 9/1966 | Hermann et al. | |
| 4,982,014 | A | 1/1991 | Freitag et al. | |
| 5,097,002 | A | 3/1992 | Sakashita et al. | |
| 5,288,778 | A | 2/1994 | Schmitter et al. | |
| 5,340,905 | A | 8/1994 | Kuehling et al. | |
| 5,717,057 | A | 2/1998 | Sakashita et al. | |
| 5,808,863 | A | 9/1998 | Radloff et al. | |
| 5,821,380 | A | 10/1998 | Holderbaum et al. | |
| 5,883,165 | A | 3/1999 | Kroehnke et al. | |
| 6,596,840 | B1 | 7/2003 | Kratschmer et al. | |
| 6,740,730 | B1 | 5/2004 | Kratschmer et al. | |
| 7,071,284 | B2 | 7/2006 | Kauth et al. | |
| 7,074,351 | B2 | 7/2006 | Doebler et al. | |
| 7,169,834 | B2 | 1/2007 | Doebler et al. | |
| 7,589,962 | B1 * | 9/2009 | Bhatia | F28D 15/0233 165/104.19 |
| 8,153,239 | B2 | 4/2012 | Nakano et al. | |
| 8,222,321 | B2 | 7/2012 | Youm et al. | |
| 8,691,393 | B2 | 4/2014 | Cook et al. | |
| 8,722,186 | B2 | 5/2014 | Burke et al. | |
| 8,811,003 | B1 * | 8/2014 | Hayashida | G06F 1/1662 361/679.08 |
| 9,167,735 | B2 | 10/2015 | Chung et al. | |
| 9,502,193 | B2 * | 11/2016 | Niu | H01H 11/00 |
| 9,505,903 | B2 | 11/2016 | Lee et al. | |
| 9,904,333 | B2 * | 2/2018 | Knopf | G06F 1/1658 |
| 10,148,000 | B2 * | 12/2018 | Hill | B29C 45/14311 |
| 10,372,166 | B2 * | 8/2019 | Gable | H05K 5/15 |
| 2005/0165148 | A1 | 7/2005 | Bogerd et al. | |
| 2011/0199728 | A1 * | 8/2011 | Reyes | G06F 1/1616 24/442 |
| 2011/0286172 | A1 * | 11/2011 | Tseng | H05K 5/0234 248/346.03 |
| 2013/0009898 | A1 * | 1/2013 | Mathew | G06F 1/169 345/173 |
| 2013/0176671 | A1 * | 7/2013 | Saito | G06F 3/0202 361/679.09 |
| 2013/0250509 | A1 * | 9/2013 | Tachikawa | G06F 1/1656 361/679.55 |
| 2015/0062807 | A1 * | 3/2015 | Gwin | G06F 1/1656 361/679.55 |
| 2015/0092337 | A1 * | 4/2015 | Tan | H05K 5/13 312/223.1 |
| 2017/0131742 | A1 * | 5/2017 | Tamura | G06F 1/1662 |
| 2020/0167739 | A1 | 5/2020 | Reyes | |
| 2020/0278747 | A1 * | 9/2020 | Ligtenberg | G06F 3/0412 |
| 2024/0107713 | A1 * | 3/2024 | Zhu | B32B 7/05 |
| 2026/0008897 | A1 * | 1/2026 | Bondi | C08J 11/12 |
| 2026/0010209 | A1 * | 1/2026 | Bondi | G06F 1/1658 |

FOREIGN PATENT DOCUMENTS

| | | | |
|---|---|---|---|
| GB | 1341318 | A | 8/1919 |
| GB | 1122003 | A | 7/1968 |
| GB | 1229482 | A | 4/1971 |
| GB | 1367790 | A | 9/1974 |
| WO | 2022152560 | A1 | 7/2022 |

OTHER PUBLICATIONS

U. Grigo, K. Kirchner and p. R. Müller "Polycarbonate" [Polycarbonates] in Becker/Braun, Kunststoff-Handbuch [Plastics Handbook], vol. 3/1, Polycarbonate, Polyacetale, Polyester, Celluloseester [Polycarbonates, Polyacetals, Polyesters, Cellulose Esters], Carl Hanser Verlag Munich, Vienna 1992, pp. 117-299.

H. Schnell, Chemistry and Physics of Polycarbonates, Interscience Publishers, New York 1964, p. 28 ff.; p. 102 ff.

D.G. Legrand, J.T. Bendler, Handbook of Polycarbonate Science and Technology, Marcel Dekker New York 2000, p. 72ff.

International Search Report issued on Jan. 17, 2024 by Authorized officer Mark Semple.

* cited by examiner

CLAMSHELL HOUSING FOR HUMAN-MACHINE INTERFACE (HMI)

CROSS REFERENCE TO RELATED APPLICATIONS

This application is a national stage application under 35 U.S.C. § 371 of PCT/US2023/075934, filed Oct. 4, 2023, which claims benefit of EP Application Serial No. 22209775.0, filed Nov. 28, 2022, and U.S. Provisional Application No. 63/420,130, filed Oct. 28, 2022, all of which are incorporated herein by reference in their entireties.

FIELD OF THE INVENTION

The present invention relates in general to human-machine interface (HMI) housings and more specifically to, a recyclable thermoplastic notebook computer cover, which is easily assembled and disassembled for recycling of its thermoplastic components.

BACKGROUND OF THE INVENTION

Most electronic devices, especially mobile devices like traditional laptops are constructed from materials and by processes that are unsatisfactory for sustainability and recycling. As those skilled in the art are aware, the A and B covers of a laptop are typically joined using one-way snap fits, adhesive tapes, adhesives, and many screws and metal screw bosses. The joining method changes based on the cost of the laptop. Before recycling can begin, these metal parts including metal-threaded inserts must be removed from the part into which it is embedded. Difficulty in removing these metal connectors causes major drawbacks to the streamlined recycling of such assemblies.

U.S. Pat. Pub. 2011/199728 in the name of Reyes discloses an enclosure for an electronic device comprising a top wall operably connected to a bottom wall via side walls, a front wall operably connected to a rear wall via the side wall, a locking mechanism operably connected to the side walls, and a mechanism for operably connecting an internal component to the enclosure, wherein the mechanism is operably connected to at least one of the walls of the enclosure.

U.S. Pat. No. 5,808,863 issues to Radloff et al., provides a computer system, or other electronic device, having two parts that are easily attached and quickly detached. One of the parts has a plurality of stakes projecting from one surface thereof, and the other part has a plurality of through openings for receiving the stakes, and a plurality of slots extending adjacent the stakes. The stakes are formed over the other part adjacent the openings to attach the second part to the first part, and a blade can be inserted in the slots to force the second part away from the first part and break the stakes to quickly detach the parts.

WO/2022/152560 in the name of Zhu et al., discloses a housing assembly based on polycarbonate material, of which at least the front cover and the back cover are easily recyclable due to its separability into different parts for all components which are attached to the front cover or the back cover and which cannot be recycled together with the front cover or the back cover, respectively. Snap-fits, interference-fits, predetermined breaking points and other means are used for an easily detachable, but for use safe connection of the single parts.

To reduce or eliminate problems, therefore, a need exists in the art for electronic device parts, such as laptop parts, to contain a greater amount of homogenous plastic and fewer metal connectors, so they may be more quickly removed and repaired or recycled than those made according to the state of the art.

SUMMARY OF THE INVENTION

Accordingly, the present invention reduces or eliminates problems inherent in the art by removing metal parts while maintaining electronic device part integrity during use through intelligent design and the use of polycarbonate. As those skilled in the art are aware, polycarbonate excels in satisfying this demand given its robust property profile. The present invention minimizes the amount of metal parts in the electronic device design through use of more homogenous plastic and incorporation of "breakaway features" for those metal parts that remain.

It is understood that the invention disclosed and described in this specification is not limited to the embodiments summarized in this Summary.

BRIEF DESCRIPTION OF THE FIGURES

The present invention will now be described for purposes of illustration and not limitation in conjunction with the figures, wherein.

DETAILED DESCRIPTION OF THE INVENTION

Figure 1:
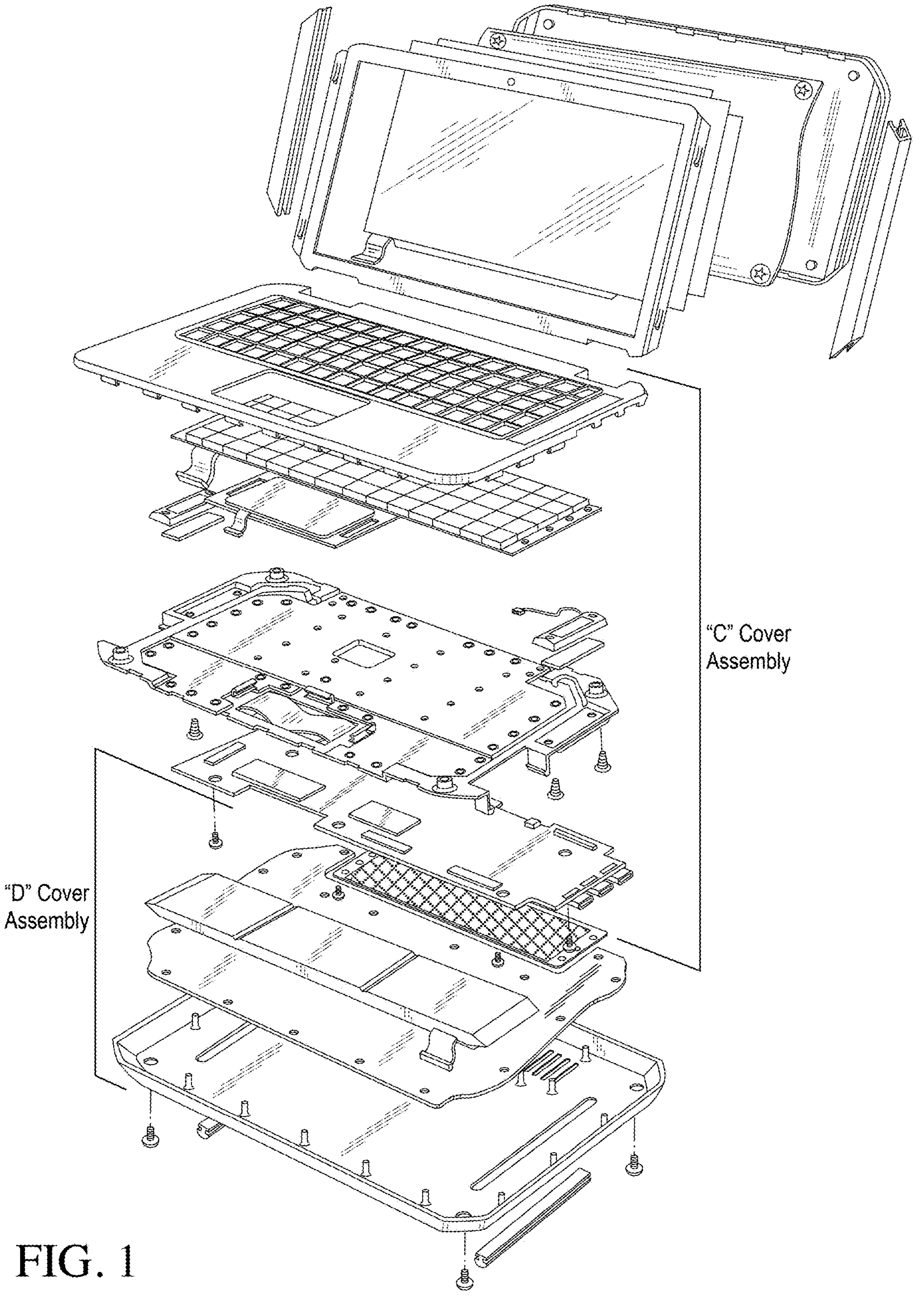
FIG. 1 shows the C and D cover assemblies, with plastic "C" cover and plastic "D" cover of the laptop housing of the invention.

The present invention will now be described for purposes of illustration and not limitation. Except in the operating examples, or where otherwise indicated, all numbers expressing quantities, percentages, and so forth in the specification are to be understood as being modified in all instances by the term "about."

Any numerical range recited in this specification is intended to include all sub-ranges of the same numerical precision subsumed within the recited range. For example, a range of "1.0 to 10.0" is intended to include all sub-ranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited in this specification is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such sub-ranges would comply with the requirements of 35 U.S.C. § 112(a), and 35 U.S.C. § 132(a). The various embodiments disclosed and described in this specification can comprise, consist of, or consist essentially of the features and characteristics as variously described herein.

Any patent, publication, or other disclosure material identified herein is incorporated by reference into this specification in its entirety unless otherwise indicated, but only to the extent that the incorporated material does not conflict with existing definitions, statements, or other disclosure material expressly set forth in this specification. As such, and to the extent necessary, the express disclosure as set forth in this specification supersedes any conflicting material incorporated by reference herein. Any material, or portion thereof, that is said to be incorporated by reference into this specification, but which conflicts with existing definitions, statements, or other disclosure material set forth herein, is only incorporated to the extent that no conflict arises between that incorporated material and the existing disclosure material. Applicant reserves the right to amend this specification to expressly recite any subject matter, or portion thereof, incorporated by reference herein.

Reference throughout this specification to "various non-limiting embodiments," "certain embodiments," or the like, means that a particular feature or characteristic may be included in an embodiment. Thus, use of the phrase "in various non-limiting embodiments," "in certain embodiments." or the like, in this specification does not necessarily refer to a common embodiment and may refer to different embodiments. Further, the particular features or characteristics may be combined in any suitable manner in one or more embodiments. Thus, the particular features or characteristics illustrated or described in connection with various or certain embodiments may be combined, in whole or in part, with the features or characteristics of one or more other embodiments without limitation. Such modifications and variations are intended to be included within the scope of the present specification.

The grammatical articles "a". "an", and "the", as used herein, are intended to include "at least one" or "one or more", unless otherwise indicated, even if "at least one" or "one or more" is expressly used in certain instances. Thus, these articles are used in this specification to refer to one or more than one (i.e., to "at least one") of the grammatical objects of the article. By way of example, and without limitation, "a component" means one or more components, and thus, possibly, more than one component is contemplated and may be employed or used in an implementation of the described embodiments. Further, the use of a singular noun includes the plural, and the use of a plural noun includes the singular, unless the context of the usage requires otherwise.

In a first embodiment, the present invention is directed to a clamshell housing for a human-machine interface (HMI) comprising a plastic "C" cover assembly and a plastic "D" cover assembly, the "C" cover comprising a plastic keyboard cover or palm rest, having a plurality of snap fittings thereon for attachment to the plastic "D" cover assembly, a keyboard having a keyboard connector electrically connecting the keyboard to a printed circuit board (PCB), a trackpad having a trackpad connector electrically connecting the trackpad to the printed circuit board (PCB), wherein the keyboard and the trackpad are each attached to the plastic "C" cover and attached through a stamped metal plate to the printed circuit board (PCB) with a plurality of plastic heat stakes, wherein a minimal plastic surround is mounted beneath the stamped metal plate onto a plurality of preformed plastic heat stakes, wherein the stamped metal plate is attached underneath the stamped metal plate to a minimal plastic surround at the plurality of preformed plastic heat stakes, wherein the printed circuit board (PCB) is attached at a plurality of plastic threaded inserts to the minimal plastic surround with a plurality of plastic "Christmas tree" fasteners; and wherein a plastic spring is formed in the minimal plastic surround to hold the trackpad in tension, and wherein the plastic "C" cover assembly is attached through a plurality of metal screws to the plastic "D" cover assembly; and the "D" cover comprising a vent mesh attached to the plastic "D" cover by the plurality of metal screws, electromagnetic interference (EMI) shielding material attached to the plastic "D" cover by the plurality of plastic heat stakes, a power source, and a plurality of press-in rubber feet inserted into slots of the plastic "D" cover.

In a second embodiment, the invention is directed to a process of recycling the clamshell housing for a human-machine interface (HMI) according to the previous paragraph, the process comprising, (a) disassembling the clamshell housing. (b) removing any non-plastic parts, (c) mechanically shredding the clamshell housing. (d) at least one of cleaning, sanitizing, and sorting the clamshell housing. (e) subjecting the clamshell housing to at least one of pyrolysis and chemolysis to obtain a monomer. (f) polymerizing the monomer to produce a polymer, and (g) optionally, pelletizing the polymer.

In state-of-the-art laptops, the "C" and "D" covers are molded separately and then joined with screws. In the present invention, the covers are joined into a clamshell design via laser welding or ultrasonic welding before assembly, transforming them into one distinct part which slides laterally over the circuit board, power source (e.g., battery), and internals of the laptop. This greatly reduces need for screws, adhesives, and other joining methods that can interfere with recycling. The inventive clamshell C/D cover is polycarbonate (PC)-based or polycarbonate/acrylonitrile-butadiene-styrene (PC/ABS)-based and can thus be recycled much easier and with higher retention rates than current designs. The clamshell is held together by a snap fit, so that the user can remove it in the future for servicing or recycling.

In various embodiments, the present invention is directed to a clamshell housing for a human-machine interface (HMI), such as electrical and electronic devices and appliances, particularly clamshell laptop covers, made to the greatest extent possible of thermoplastic materials. The clamshell housing is made of an assembly designed for improved sustainability because it uses less metal hardware, inserts, glues, adhesives, paints, coatings, and it includes larger homogeneous thermoplastic parts, making for easier end of life recycling. The inventive clamshell housing also is easier to disassemble for service and repair.

In certain embodiments, the assembly of the invention may include slide-on clips in the form of "C" shaped channels (i.e., "C" shaped cross-section) to hold parts comprising integrated flanges tightly together, i.e., like a clamp. (e.g., allows for clamping of LCD screen non-permanently in a laptop). The clips may be made of a material such as plastic (preferably the same plastic as the housing), metal, rubber, thermoplastic polyurethane (TPU), and combinations of these materials. The assembly may take two different configurations: a clamshell with flange, or a vertically sliding with a plurality of set screws.

Various embodiments of the housing of the invention include break-away features for in-molded metal parts, e.g., predetermined breaking points (designed weaknesses that fail when desired or with a specific undefined tool). Certain embodiments may include plastic heat-stakes to replace metal versions. Selected embodiments may include press-on grommets to replace screws and promote repeated assembly/disassembly. In other embodiments, there may be a connection of same-material thermoplastic parts via welding, e.g., ultrasonic welding, laser welding, vibrational welding, infrared welding, hot plate welding. In some embodiments, intermittent welding (also referred to as "stitch weld" or "skip weld") may be used between thermoplastic parts. In various embodiments, thermal staking may be used instead of glue to fasten the electromagnetic interference (EMI) shielding material 752 in place.

The molded parts of the inventive housing are made of a molded plastic material, and preferably made of substantially the same plastic material. Preferably, each of these components comprise 50-100% the same material. In preferred embodiments, the components comprise at least 60%, at least 70%, or at least 80% the same material. In a particularly preferred embodiment, the molded parts comprise at least 90% of the same material, or even 100% the same material.

In selected embodiments the inventive housings are thermoplastic compositions comprising A) an aromatic polycarbonate, B) a polyether polyol and optionally, C) at least one additive selected from the group consisting of flame retardants, antidripping agents, impact modifiers, fillers, antistats, coloring agents, pigments, thermal stabilizers different from component B, lubricants, demolding agents. UV absorbers, IR absorbers, hydrolysis stabilizers, and compatibilizers.

Component A

According to the invention. "polycarbonate" is to be understood as meaning both homopolycarbonates and copolycarbonates, in particular, polycarbonates. These polycarbonates may be linear or branched in known fashion. According to the invention, mixtures of polycarbonates may also be used.

A "polycarbonate" or a "polycarbonate material" is a thermoplastic material preferably comprising at least 50 wt. % polycarbonate, more preferably at least 60 wt. % polycarbonate, even more preferably at least 65 wt. % polycarbonate.

A portion of up to 80 mol %, preferably of 20 mol % to 50 mol %, of the carbonate groups in the polycarbonates used in accordance with the invention may be replaced by aromatic dicarboxylic ester groups. Polycarbonates of this kind, incorporating both acid radicals from the carbonic acid and acid radicals from aromatic dicarboxylic acids in the molecule chain, are referred to as "aromatic polyestercarbonates." In the context of the present invention, they are encompassed by the umbrella term of the thermoplastic aromatic polycarbonates. The replacement of the carbonate groups by aromatic dicarboxylic acid ester groups takes place essentially stoichiometrically and quantitatively, so that the molar ratio of the reaction partners can also be found in the finished polyestercarbonate. The incorporation of dicarboxylic acid ester groups can be statistical as well as in blocks.

In various embodiments, the thermoplastic polycarbonates, including the thermoplastic aromatic polyestercarbonates, have weight average molecular weights $M_w$, determined by gel permeation chromatography under use of $CH_2Cl_2$ as diluent, of from 10,000 g/mol to 35,000 g/mol, in certain embodiments, from 12,000 g/mol to 32,000 g/mol, in selected embodiments, from 15,000 g/mol to 32,000 g/mol, and in particular embodiments, from 20,000 g/mol to 31,500 g/mol. The gel permeation chromatography is conducted under the following conditions: calibration with linear polycarbonate (made from bisphenol A and phosgene) of known molecular weight distribution, standards from PSS Polymer Standards Service GmbH, Germany, calibration according to method 2301-0257502-09D (from the year 2009 in German language) from Currenta GmbH & Co. OHG, Leverkusen. Diluent methylene chloride. Column combination from cross-linked styrene-divinylbenzene resin. Diameter of the analytical columns: 7.5 mm, length: 300 mm. Particle size of the column material: 3 μm to 20 μm. Concentration of the solutions: 0.2 wt.-%. Flow rate: 1.0 ml/min, temperature of the solution: 30° C. Detection by means of a refractive index (RI)-detector.

Details regarding the preparation of polycarbonates are disclosed in many patent documents spanning approximately the last 60 years. Reference may be made here to Schnell, "Chemistry and Physics of Polycarbonates", Polymer Reviews, Volume 9. Interscience Publishers, New York, London, Sydney 1964, to D. Freitag, U. Grigo, P. R. Müller, H. Nouvertné, BAYER AG, "Polycarbonates" in Encyclopedia of Polymer Science and Engineering, Volume 11, Second Edition, 1988, pages 648-718 and finally to U. Grigo, K. Kirchner and P. R. Müller "Polycarbonate" [Polycarbonates] in Becker/Braun, Kunststoff-Handbuch [Plastics Handbook], volume 3/1, Polycarbonate, Polyacetale, Polyester, Celluloseester [Polycarbonates, Polyacetals, Polyesters, Cellulose Esters], Carl Hanser Verlag Munich, Vienna 1992, pages 117-299.

Various processes for the production of the polycarbonates which are useful in the present invention, including polyestercarbonates, are the interfacial process and the melt transesterification process (e.g., U.S. Pat. Nos. 5,097,002; 5,340,905; 5,717,057; 6,596,840; 6,740,730; and 7,071,284).

Aromatic polycarbonates are prepared, for example, by reaction of dihydroxyaryl compounds with carbonyl halides, preferably phosgene, and/or with aromatic dicarbonyl dihalides, preferably benzenedicarbonyl dihalides, by the interfacial process, optionally with use of chain terminators and optionally with use of trifunctional or more than trifunctional branching agents, wherein for the production of polyestercarbonates a part of the carbonic acid derivatives is replaced with aromatic dicarboxylic acids or derivatives of dicarboxylic acids, namely according to the carbonate structure units in the aromatic polycarbonates by dicarboxylic acid ester structure units. Preparation via a melt polymerization process by reaction of dihydroxyaryl compounds with, for example, diphenyl carbonate is likewise possible.

Dihydroxyaryl compounds suitable for the preparation of polycarbonates are those of the formula (1)

$$HO—Z—OH, \qquad (1)$$

wherein,

Z is an aromatic radical of 6 to 30 carbon atoms which may contain one or more aromatic rings, may be substituted and may contain aliphatic, cycloaliphatic radicals, alkylaryl groups, or heteroatoms as bridging elements.

Preferably, Z in formula (1) is a radical of the formula (2)

(2)

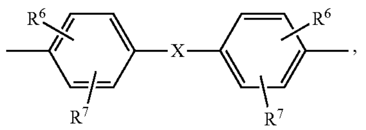

wherein $R^6$ and $R^7$ are each independently H, $C_1$-$C_{18}$-alkyl-, $C_1$-$C_{18}$-alkoxy, halogen such as Cl or Br or in each case optionally substituted aryl or aralkyl, in some embodiments H or $C_1$-$C_{12}$-alkyl, in certain embodiments H or $C_1$-$C_8$-alkyl and in selected embodiments H or methyl, and X is a single bond, —$SO_2$—, —CO—, —O—, —S—, $C_1$-$C_6$-alkylene, $C_2$-$C_5$-alkylidene or $C_5$-$C_6$-cycloalkylidene which may be substituted by $C_1$-$C_6$-alkyl, preferably methyl or ethyl, or else $C_6$-$C_{12}$-arylene which may optionally be fused to further aromatic rings containing heteroatoms.

In various embodiments, X is a single bond, $C_1$-$C_6$-alkylene, $C_2$-$C_5$-alkylidene, $C_5$-$C_6$-cycloalkylidene, —O—, —SO—, —CO—, —S—, —$SO_2$— or a radical of the formula (2a)

(2a)

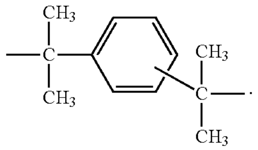

Examples of dihydroxyaryl compounds suitable for the preparation of the polycarbonates for use in accordance with the invention include, but are not limited to, hydroquinone, resorcinol, dihydroxy diphenyl, bis(hydroxyphenyl)alkanes, bis(hydroxyphenyl)cycloalkanes, bis(hydroxyphenyl) sulphides, bis(hydroxyphenyl) ethers, bis(hydroxyphenyl)ketones, bis(hydroxyphenyl) sulphones, bis(hydroxyphenyl) sulphoxides, α,α'-bis(hydroxyphenyl)diisopropylbenzenes and the alkylated, ring-alkylated and ring-halogenated compounds thereof.

Useful dihydroxyaryl compounds are 4,4'-dihydroxydiphenyl, 2,2-bis(4-hydroxyphenyl)propane (bisphenol A), 2,4-bis(4-hydroxyphenyl)-2-methylbutane, dimethyl-bisphenol A, 1,1-bis(4-hydroxyphenyl)-p-diisopropylbenzene, 2,2-bis(3-methyl-4-hydroxyphenyl)propane. 2,2-bis(3-methyl-4-hydroxyphenyl)propane, bis(3,5-dimethyl-4-hydroxyphenyl)methane, 2,2-bis(3,5-dimethyl-4-hydroxyphenyl)propane, bis(3,5-dimethyl-4-hydroxyphenyl)sulfone, 2,4-bis(3,5-dimethyl-4-hydroxyphenyl)-2-methylbutane, 1,1-bis(3,5-dimethyl-4-hydroxyphenyl)-p-diisopropylbenzene and 1,1-bis(4-hydroxyphenyl)-3,3,5-trimethylcyclohexane, and bisphenols (I) to (III)

(I)

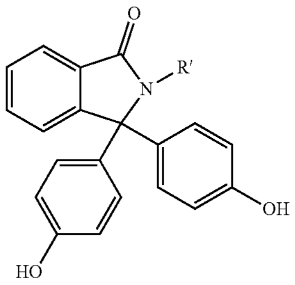

(II)

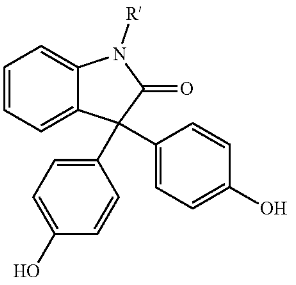

(III)

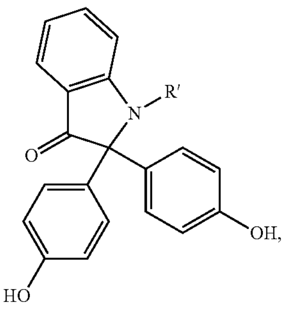

R' in each case is $C_1$-$C_4$-alkyl, aralkyl or aryl, in certain embodiments, methyl or phenyl, in selected embodiments, methyl.

In certain embodiments, the dihydroxyaryl compounds include 2,2-bis-(4-hydroxyphenyl)-propane (bisphenol A). 2,2-bis(3,5-dimethyl-4-hydroxyphenyl)propane. 1,1-bis(4-hydroxyphenyl)cyclohexane and 1,1-bis(4-hydroxyphenyl)-3,3,5-trimethylcyclohexane (bisphenol TMC) and dimethyl-bisphenol A as well as the dihydroxyaryl compounds of formula (I), (II) and (III).

These and further suitable dihydroxyaryl compounds are described, for example, in U.S. Pat. Nos. 2,991,273; 2,999,835; 2,999,846; 3,148,172; 3,271,367; 4,982,014; DE 2 036 052 A. and DE 3 832 396 A: in French patent application 1 561 518 A1; GB1122003; GB1229482; GB1341318; GB1367790; in the monograph, H. Schnell, Chemistry and Physics of Polycarbonates, Interscience Publishers, New York 1964, p. 28 ff.; p. 102 ff., and in D. G. Legrand, J. T. Bendler, Handbook of Polycarbonate Science and Technology. Marcel Dekker New York 2000, p. 72ff.

Only one dihydroxyaryl compound is used in the case of the homopolycarbonates; two or more dihydroxyaryl compounds are used in the case of copolycarbonates. The dihydroxyaryl compounds employed, as well as components of the compositions used in accordance with the invention, similarly to all other chemicals and assistants added to the synthesis, may be contaminated with the contaminants from their own synthesis, handling, and storage. However, it is desirable to employ the purest possible raw materials.

Examples of suitable carbonic acid derivatives include phosgene and diphenyl carbonate.

Suitable chain terminators useful in the production of polycarbonates are monophenols. Suitable monophenols include, for example, phenol itself, alkylphenols such as cresols, p-tert-butylphenol, cumylphenol, and mixtures thereof.

In various embodiments, chain terminators include phenols mono- or polysubstituted by linear or branched $C_1$-$C_{30}$-alkyl radicals, unsubstituted or substituted by tert-butyl. In selected embodiments, the chain terminators are phenol, cumylphenol and p-tert-butylphenol. The amount of chain terminator to be used may be 0.1 to 5 mol %, based on moles of dihydroxyaryl compounds used in each case. The chain terminators can be added before, during or after the reaction with a carbonic acid derivative.

Suitable branching agents include trifunctional or more than trifunctional compounds familiar in polycarbonate chemistry, particularly those having three or more than three phenolic OH groups. Examples of suitable branching agents include, but are not limited to, 1,3,5-tri(4-hydroxyphenyl) benzene, 1,1,1-tri(4-hydroxyphenyl)ethane, tri(4-hydroxyphenyl)phenylmethane, 2,4-bis(4-hydroxyphenylisopropyl) phenol. 2,6-bis(2-hydroxy-5'-methylbenzyl)-4-methylphenol, 2-(4-hydroxyphenyl)-2-(2,4-dihydroxyphenyl)propane, tetra(4-hydroxyphenyl)methane, tetra(4-(4-hydroxyphenylisopropyl)phenoxy)methane and 1,4-bis((4',4"-dihydroxytriphenyl)methyl)benzene and 3,3-bis(3-methyl-4-hydroxyphenyl)-2-oxo-2,3-dihydroindole. The amount of any branching agents to be used may be 0.05 mol % to 2 mol %, based on moles of dihydroxy aryl compounds used in each case. The branching agents can either be initially charged together with the dihydroxyaryl compounds and the chain terminators in the aqueous alkaline phase or added dissolved in an organic solvent before the phosgenation. In the case of the transesterification process, the branching agents are used together with the dihydroxyaryl compounds.

In various embodiments, the polycarbonates are homopolycarbonate based on bisphenol A, homopolycarbonate based on 1,3-bis(4-hydroxyphenyl)-3,3,5-trimethylcyclohexane and copolycarbonates based on the two monomers bisphenol A and 1,1-bis(4-hydroxyphenyl)-3,3,5-trimethylcyclohexane, and homo- or copolycarbonates derived from the dihydroxyaryl compounds of the formulae (I) to (III), (I)

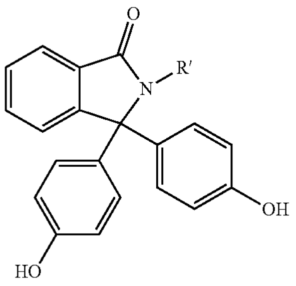

-continued (II)

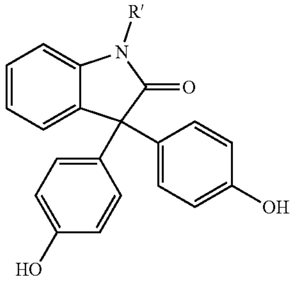

(III)

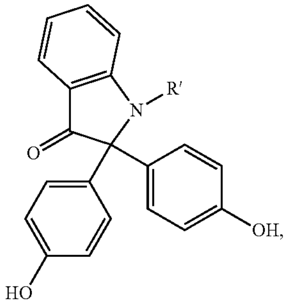

wherein R' in each case is $C_1$-$C_4$-alkyl, aralkyl or aryl, in certain embodiments methyl or phenyl, in selected embodiments methyl, and in particular embodiments with bisphenol A as comonomer.

To facilitate incorporation of additives, component A may be used in the form of powders, pellets, or mixtures thereof.

In various embodiments, the polycarbonate has an MVR of from 4.5 to 34 $cm^3$/(10 min), in certain embodiments of from 5.5 to 12 $cm^3$/(10 min), in selected embodiments of from 6 to 10 $cm^3$/(10 min), determined according to ISO 1133:2012-03 at a test temperature of 300° C. and 1.2 kg load.

A mixture of different polycarbonates may be used as component A, for example a mixture of the polycarbonates A1 and A2, wherein A2 is a polycarbonate in powdered form. As used herein, the properties for the polycarbonate refer to a respective mixture.

In various embodiments, the compositions contain 50 to 98.5 wt. %, in some embodiments, 69.85 to 98.0 wt. %, in certain embodiments 85 to 97.5 wt. %, in selected embodiments 90.0 to 97.5 wt. %, and in particular embodiments, 93.0 wt. % to 97.5 wt. % of the aromatic polycarbonate.

Component B

Component B comprises one or more stabilizers in the form of a polyether polyol. As those skilled in the art are aware, polyether polyols are the product of the polymerization of epoxides, such as ethylene oxide (EO), propylene oxide (PO), butylene oxide, styrene oxide, and epichlorohydrin, with themselves or by addition of such epoxides, optionally in admixture or sequentially, to starting components with reactive hydrogen atoms, such as water, alcohol, ammonia or amines. Such "starter molecules" usually have a functionality of from 1 to 6. Depending on the process control, such polyether polyols may be homopolymers, block copolymers, random copolymers, capped polymers, or polymers tipped with a mixture of different epoxides.

To specify such polyether polyols, various characteristics have become established in the art:

i) hydroxyl functionality, which depends on the starter molecule starting from which the polyether polyol is synthesized, ii) hydroxyl or OH number, which is a measure of the content of hydroxyl groups stated in mg of KOH/g, determined according to DIN 53240-3:2016-03.

iii) when epoxides in which the ring opening causes the formation of different. i.e., primary or secondary) hydroxyl groups are used, on the one hand, the proportion of the respective epoxides in the polyether polyol is stated, and on the other hand, the proportion of primary or secondary hydroxyl groups based on the total number of hydroxyl groups present in the polyether polyol is stated, and iv) the molecular weight ($M_n$ or $M_w$), which is a measure of the length of the polyoxyalkylene chains of the polyether polyols.

In various embodiments, polyether polyols have a number average molecular weight $M_n$ of from 100 to 6200 g/mol, in certain embodiments from 1500 to 4000 g/mol, and in selected embodiments from 1800 to 3000 g/mol, where. $M_n$ is calculated according to the following formula:

$$M_n = 56100 * F/OHN.$$

OH-number (OHN) is determined via hydroxyl end group titration according to DIN 53240-3:2016-03. OHN in mg KOH/g is inserted in the given formula. F is the functionality, which in the context of this invention related to hydroxyl end groups. Acid end groups, if any, are not taken into account. F is defined as number of hydroxyl end groups, divided by the number of molecules in an ensemble, meaning F is the average number of hydroxyl end groups of a molecule of a compound. F is normally apparent from the recipe for preparing the polyol but may alternatively be determined by $^1$H NMR.

In various embodiments, the polyether polyols may be formed from repeating ethylene oxide and propylene oxide units, e.g., with a share of 35 to 100 wt. % propylene oxide units, in certain embodiments 50 to 100 wt. % propylene oxide units. The copolymers may be statistical copolymers, gradient copolymers, alternating copolymers or block copolymers formed from ethylene oxide and propylene oxide. In selected embodiments, the polyether polyols are linear polymers.

Useful polyether polyols are those formed from repeating propylene oxide units with a 1,2-diol as starter molecule, more preferably with propylene glycol as the starter molecule. The polyether polyols may be end-capped. In selected embodiments, the polyether polyol is end capped. A preferred agent for end-capping is dihydropyran (3,4-dihydro-2H-pyran).

Suitable polyether polyols, formed from repeating propylene oxide and/or ethylene oxide units are, e.g., DESMOPHEN, ACCLAIM, ARCOL, BAYCOLL, BAYFILL, BAYFLEX, BAYGAL, PET, POLYETHER polyols from Covestro Deutschland AG (for example DESMOPHEN 3600Z, DESMOPHEN 1900U. ACCLAIM Polyol 2200, ACCLAIM Polyol 4000I. ARCOL Polyol 1004, ARCOL Polyol 1010, ARCOL Polyol 1030, ARCOL Polyol 1070, BAYCOLL BD 1110, BAYFILL VPPU 0789, BAYGAL K55, PET 1004, POLYETHER S180). Further suitable homo-polyethylene oxides are, for example, the PLURIOL E polyols from BASF SE. Suitable homo-propylene oxides are, for example, PLURIOL P polyols from BASF SE or MULTRANOL polyols from Covestro Deutschland AG, SYNALOX polyols from The Dow Chemical Company and CARADOL polyols from Shell Chemicals. Suitable mixed copolymers formed from ethylene oxide and propylene oxide are, for example, the PLURONIC PE or PLURIOL RPE polyols from BASF SE.

In certain embodiments, the polyether polyols may be those formed from repeating propylene oxide units with propylene glycol as starter molecule, an OH number within a range of from 50 to 70 mg KOH/g determined according to DIN 53240-3:2016-03, and having a hydroxyl functionality of 2, a proportion of primary hydroxyl groups within a range of from 0 to 3%, based on the total number of primary and secondary hydroxyl groups, having a propylene oxide content of at least 95 wt. % and ethylene oxide content of up to 3 wt. %, in selected embodiments, those without any ethylene oxide units, but only with propylene oxide units.

The compositions useful with the invention may comprise polyether polyols in various embodiments in an amount of from 0.1 to 5 wt. %, in certain embodiments, 0.1 wt. % to 2 wt. %, in selected embodiments, 0.5 wt. % to 1 wt. %, and in particular embodiments, 0.5 wt. % to 1.0 wt. %, wherein wt. % refers to the weight of the composition.

Component C

The compositions useful in the inventive housing optionally may comprise additives known to those in the art, including, but not limited to, flame retardants, antidripping agents, impact modifiers, fillers, antistats, coloring agents, pigments, thermal stabilizers different from component B, lubricants, demolding agents. UV absorbers, IR absorbers, hydrolysis stabilizers, and compatibilizers.

Such additives as typically added in the case of polycarbonates are described. e.g., in U.S. Pat. Nos. 5,288.778:5, 821.380; and 5,883,165 and in "Plastics Additives Handbook". Hans Zweifel, 5th Edition 2000, Hanser Verlag, Munich.

The amount of such additives in various embodiments is up to 30 wt. %, in some embodiments up to 10 wt. %, in certain embodiments up to 6 wt. %, in selected embodiments 0.01 to 3 wt. %, and in particular embodiments 1 wt. %, with all values referring to the composition and all including the upper value.

Useful demolding agents include, but are not limited to, pentaerythrityl tetrastearate (PETS), glycerine monostearate (GMS), their carbonates, and mixtures of any of these.

In various embodiments, up to 0.1 wt. %, in certain embodiments, 0.0001 wt. % to 0.001 wt. %, in selected embodiments, 0.0004 wt. % to 0.001 wt. %, of one or more coloring agents are used as additive. The amount "to 0.001 wt. % of one or more coloring agents" means that up to 0.001 wt. % (inclusive) of coloring agents in total are included. In a mixture of two or more coloring agents, the upper limit for the mixture of coloring agents is 0.001 wt. %. Coloring agents may be included to improve the visual impression if it is intended to compensate for a minimum discoloration after irradiation, if present. It is however also possible to use compositions without any coloring agents. It is also possible to use even more coloring agents.

Coloring agents or pigments useful in the context of the present invention include, e.g. sulfur-containing pigments as cadmium red or cadmium yellow, iron cyanide-based pigments as Prussian Blue, oxide pigments as titan dioxide, zinc oxide, red iron oxide, black iron oxide, chromium oxide, titanium yellow, zinc-iron-based brown, titan-cobalt-based green, cobalt blue, copper-chromium-based black, copper-iron-based black or chromium-based pigments as chromium yellow; phthalocyanine-based coloring agents as copper-phthalocyanine blue or copper-phthalocyanine green, condensed polycyclic coloring agents and pigments as azo-based ones (for example nickel-azo-yellow), sulfur-indigo coloring agents, perinone-based, perylene-based, quinacridone-based, dioxazine-based, isoindolinone-based, and quinophthalone-based derivatives, anthraquinone-based, heterocyclic systems.

Specific examples for coloring agents include, but are not limited to, commercial products as MACROLEX Blue RR, MACROLEX Violet 3R. MACROLEX Red EG. MACROLEX Violet B (Lanxess AG, Germany). SUMIPLAST Violet RR, SUMIPLAST Violet B, SUMIPLAST Blue OR, (Sumitomo Chemical Co., Ltd.), DIARESIN Violet D, DIARESIN Blue G, DIARESIN Blue N (Mitsubishi Chemical Corporation), HELIOGEN Blue and HELIOGEN Green (BASF AG, Germany). Further suitable coloring agents are, e.g., AMAPLAST Yellow GHS (CAS 13676-91-0; SOLVENT YELLOW 163; C.I. 58840); KEYPLAST Blue KR (CAS 116-75-6; SOLVENT BLUE 104; C.I. 61568). HELIOGEN BLUE types (e.g., HELIOGEN BLUE K 6911; CAS 147-14-8; PIGMENT BLUE 15:1; C.I. 74160) as well as HELIOGEN GREEN types (as e.g. HELIOGEN GREEN K 8730; CAS 1328-53-6; PIGMENT GREEN 7; C.I. 74260). Cyanine-, quinolone-, anthraquinone-, phthalocyanine-derivatives may be particularly useful.

Suitable pigments include, but are not limited to, titan dioxide, talc, wollastonite, and mica. Carbon black may be a suitable pigment in various embodiments, although, where carbon black is used, the amount is very low, i.e., only up to <0.1 wt. %, to avoid any effect of coloring by carbon black.

In certain embodiments, compositions may be used that contain blue and/or violet coloring agents to partially compensate for the visual yellow color impression which is a consequence of damage by irradiation. In combination with the stabilizer combination, this gives the least colored ready-to-use articles.

Optionally, the composition may comprise a UV absorber. Various UV absorbers are those having as low a transmission as possible below 400 nm and as high a transmission as possible above 400 nm. Such UV absorbers are known in the art and described, e.g., in U.S. Pat. Nos. 5,288.778:5,821, 380; and 5,883,165. Ultraviolet absorbers particularly suitable for use in the composition according to the invention are selected from benzotriazoles, triazines, benzophenones, and arylated cyanoacrylates.

Particularly suitable ultraviolet absorbers are hydroxy benzotriazoles, such as 2-(3',5'-bis(1,1-dimethylbenzyl)-2'-hydroxyphenyl)benzotriazole (TINUVIN 234, BASF), 2-(2'-hydroxy-5'-(tert-octyl)phenyl)benzotriazole (TINUVIN 329, BASF), bis(3-(2H-benzotriazolyl)-2-hydroxy-5-tert-octyl)methane (TINUVIN 360, BASF), 2-(4,6-diphenyl-1,3,5-triazin-2-yl)-5-(hexyloxy)phenol (TINUVIN 1577, BASF), and also benzophenones such as 2,4-dihydroxy benzophenone (CHIMASSORB 22, BASF) and 2-hydroxy-4-(octyloxy)benzophenone (CHIMASSORB 81. BASF), 2,2-bis [[(2-cyano-1-oxo-3,3-diphenyl-2-propenyl) oxy]methyl]-1,3-propanediyl ester (9CI) (UVINUL 3030. BASF AG), 2-[2-hydroxy-4-(2-ethylhexyl)oxy]phenyl-4,6-di(4-phenyl)phenyl-1,3,5-triazine (TINUVIN 1600. BASF,), tetraethyl-2,2'-(1,4-phenylenedimethylidene)bismalonate (HOSTAVIN B-Cap, Clariant) or N-(2-ethoxyphenyl)-N'-(2-ethylphenyl)ethanediamide (TINUVIN 312, CAS No. 23949-66-8, BASF). Particularly preferred specific UV absorbers are TINUVIN 360. TINUVIN 329 and/or TINUVIN 312, very particular preference being given to TINUVIN 329 and TINUVIN 312. It is also possible to employ mixtures of these ultraviolet absorbers.

Suitable IR absorbers are described, in a variety of patents including U.S. Pat. Nos. 7,074.351:7,169,834:8, 153,239; and in U.S. Pat. Pub. 2005/0165148. Of those mentioned in the literature, boride- and/or tungstate-based IR absorbers, in particular, cesium tungstate or zinc-doped cesium tungstate, as well as ITO- or ATO-based IR absorbers and combinations thereof are particularly useful.

Suitable impact modifiers are core-shell type impact modifiers, including, but not limited to, acrylonitrile butadiene styrene (ABS), copolymer of methyl methacrylate, acrylonitrile, butadiene and styrene (MBS), acryl-based, silicone-acryl-based impact modifiers, and non-core-shell type impact modifiers.

The polycarbonate compositions useful according to the invention may comprise organic and inorganic fillers in the usual amounts. Suitable fillers include, but are not limited to, glass fibers and carbon fibers, cellulosics, graphite, graphene, and carbon nanotubes, chalk, quartz powder, titanium dioxide, silicates, aluminosilicates, e.g., talc, wollastonite, montmorillonite, also modified by ion exchange, kaolin, zeolite, vermiculite, aluminium oxide, and silica. Mixtures of these or these and other fillers may also be used.

Polytetrafluoroethylene may be used as an antidripping agent.

Sulfur-containing stabilizers may be used including, but not limited to, 3,3'-thiodipropionic, distearyl disulfide (HOSTANOX SE 10, Clariant), pentaerythrityl tetrakis(3-laurylthiopropionate) (SOGNOX 4120, Songwon International AG) and bis-(phenylsulfonyl)methane.

The polymer compositions useful in the invention, comprising components A, B, and optionally C, are produced by standard incorporation processes via combination, mixing and homogenization of the individual constituents, especially with the homogenization taking place in the melt under the action of shear forces. If appropriate, combination and mixing prior to the melt homogenization occurs using powder premixes. For all components used, it is desirable to employ the purest possible compounds.

Various embodiments may use premixes of granules or granules and powders with components B and optionally C. Other embodiments may use premixes which have been produced from solutions of the mixture components in suitable solvents, in which case homogenization is optionally effected in solution and the solvent is removed.

It is possible to introduce components B and optionally C into the polycarbonate by known methods or as a masterbatch. Masterbatches may be used in selected embodiments for incorporation of component C.

In this context, the composition useful in the invention may be combined, mixed, homogenized and subsequently extruded in customary apparatus such as screw extruders (TSE twin-screw extruders for example), kneaders or BRABENDER or BANBURY mills. In these embodiments, the extrudate may be cooled and comminuted after extrusion. It is also possible to premix individual components and to add the remaining starting materials individually and/or likewise in a mixture.

It is possible in various embodiments to combine and mix a premix in the melt in the plastifying unit of an injection-molding machine. In these embodiments, the melt is converted directly to a shaped body in the subsequent step.

The manufacture of the molded parts from the compositions according to the invention in various embodiments may be accomplished by injection-molding, extrusion, or rapid-heat cycle molding.

Such compositions are useful for the manufacture of injection-molded parts or extrudates for a housing of a human-machine interface (HMI). Injection-molded parts and extrudates are understood as being molded polycarbonate assemblies such as the laptop covers exemplified in this Specification. The clamshell housings of the invention preferably are made of homogenous polycarbonate to facilitate efficient recycling.

Although exemplified herein in the context of a laptop computer housing, the invention is not to be considered so limited. The invention also includes clamshell housing assemblies for a human-machine interface (HMI), such as a tablet computer, a notebook computer, a desktop computer, a television, a gaming device, an advertising display, a power source (e.g., battery), a monitor, a camera, a server, an access control, point of sale equipment, an e-reader, a projector, a thermostat, a home automation portal, a kitchen appliance, an automotive part, a healthcare device, a surgical device, a smart hub, a mobile phone, a GPS receiver, a transceiver, a remote control, a head lamp, control electronics, a router-WLAN or LAN, a wired or wireless access point, and an electrical power source. Such devices comprising a housing according to the invention, including the preferred embodiments, are also subject matter of the invention.

FIG. 1 shows the plastic "C" cover assembly and plastic "D" cover assembly of the laptop computer housing of the invention 1.

Figure 2:
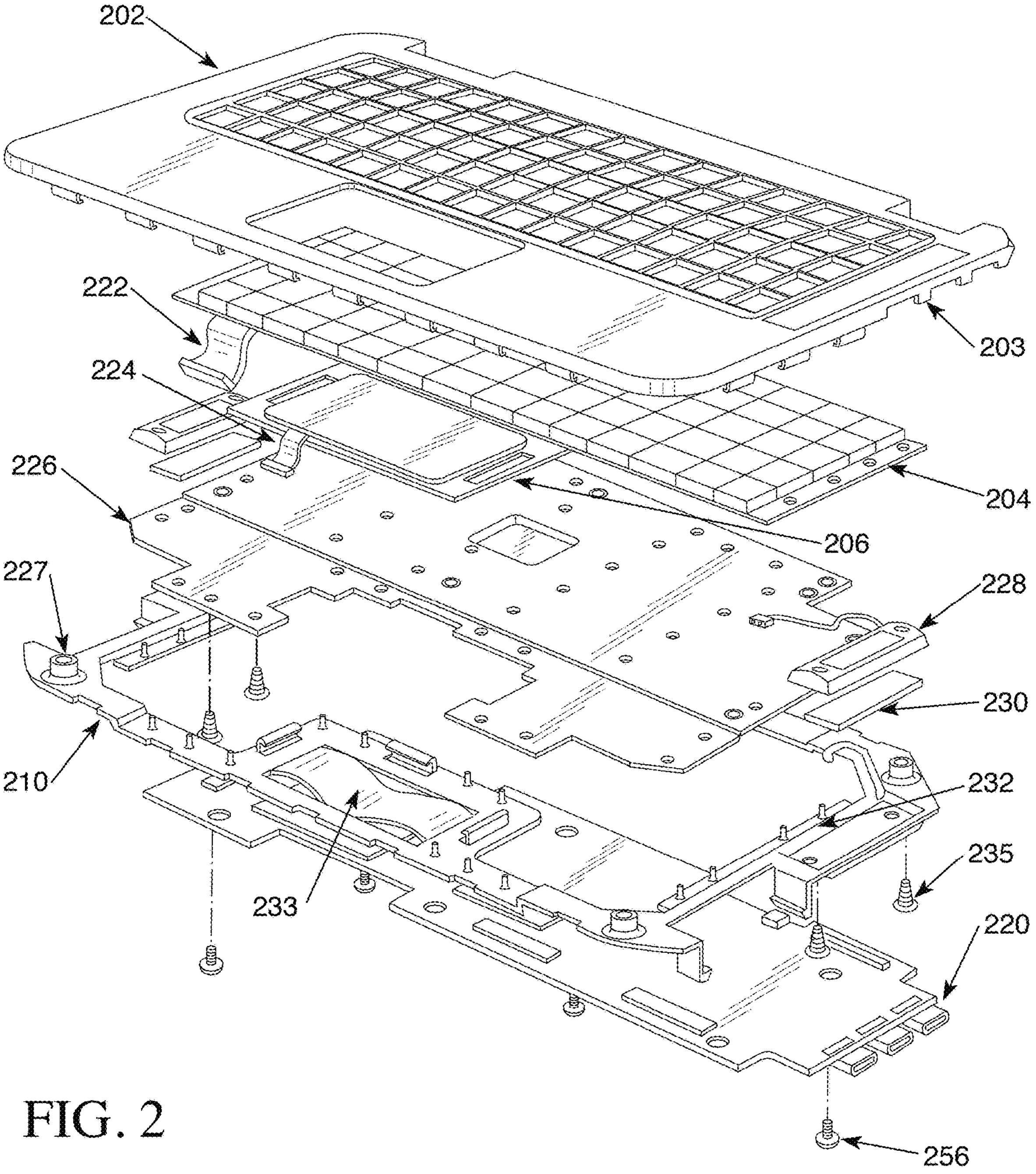
FIG. 2 depicts the plastic "C" cover in greater detail.
Figure 7:
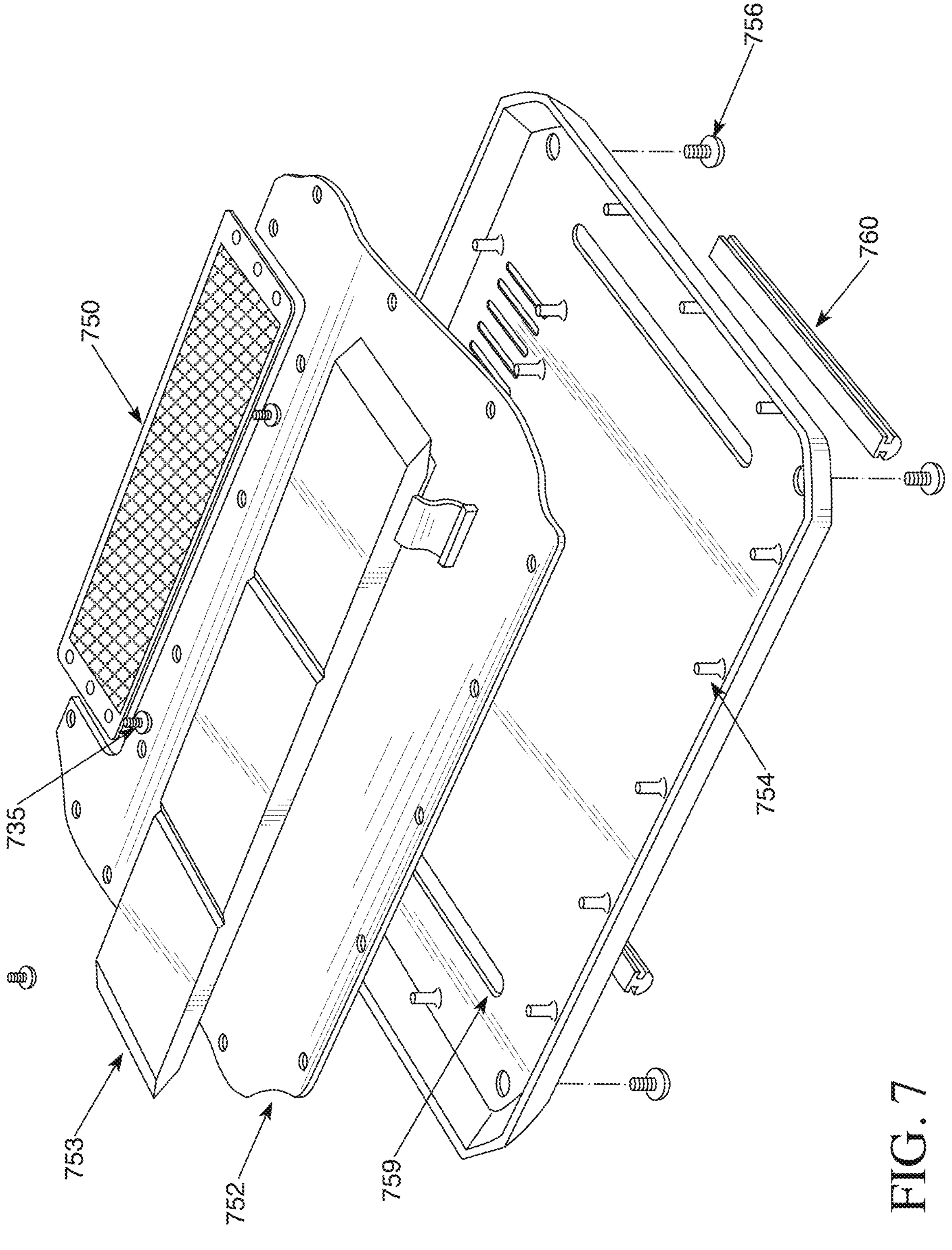
FIG. 7 provides an enlarged view of the plastic "D" cover of FIG. 1.

As shown in an exploded view in FIG. 2, the "C" cover includes plastic key board cover, commonly known as the palm rest, 202 with snap fittings 203 for attachment to the "D" cover (which is shown in FIG. 7) and keyboard 204 and trackpad 206. Keyboard 204 and trackpad 206 are attached to the "C" cover and through stamped metal plate 226 to printed circuit board (PCB) 220 with preformed plastic heat stakes 232. Keyboard 204 and trackpad 206 are electrically connected to printed circuit board (PCB) 220 by keyboard connector 222 and trackpad connector 224. Minimal plastic surround 210 is mounted beneath stamped metal plate 226 by a plurality of preformed plastic heat stakes 232. Other electronic devices such as speakers 228 resting on foam 230 for vibration reduction may be pinned to the stamped metal plate 226 with a plurality of plastic "Christmas tree" fasteners 235. Printed circuit board (PCB) 220 is attached at metal threaded insert 227 to minimal plastic surround 210 with plastic "Christmas tree" fastener 235. A Plastic spring 233 is formed in minimal plastic surround 210 to hold the trackpad 206 in tension, removing the need for foam. A reduced number of conventional screws 256 are used to secure the assembly.

Figure 3:
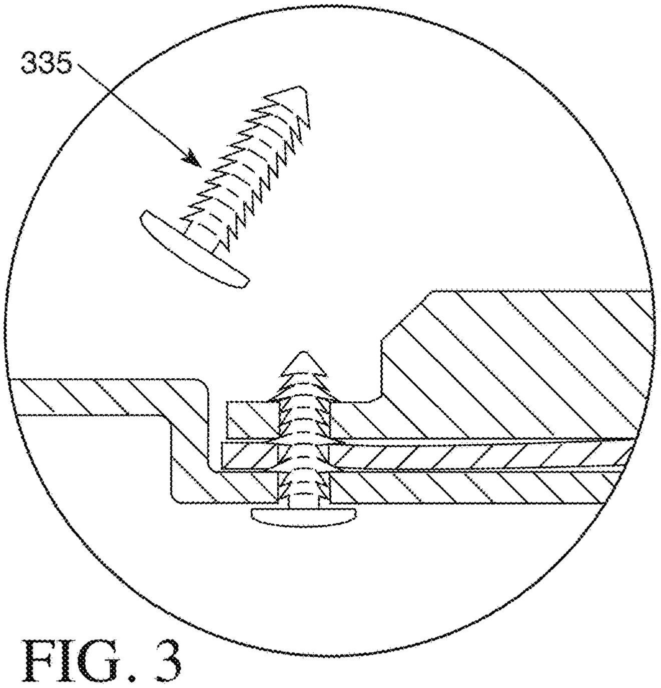
FIG. 3 illustrates use of plastic push-in fasteners instead of metal screws for attaching various components to the laptop.

FIG. 3 illustrates use of a plastic "Christmas tree" fastener 335 instead of a metal screw for attaching various components to the laptop computer.

Figure 4:
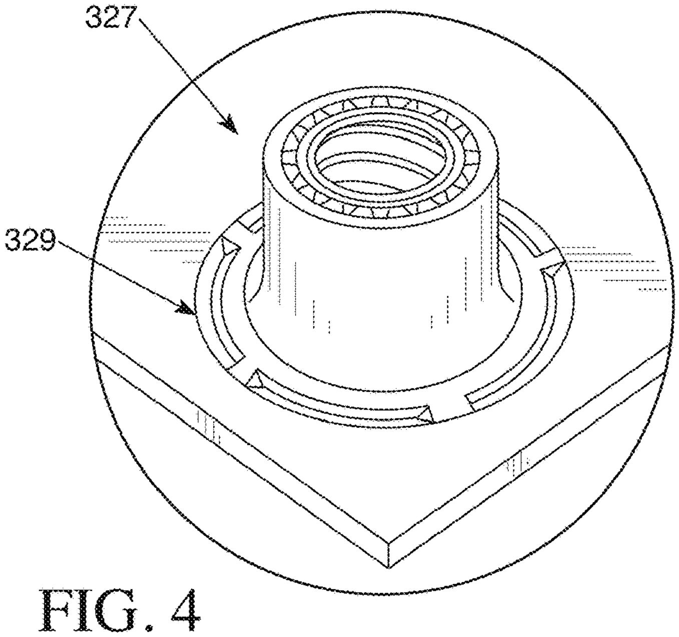
FIG. 4 illustrates a plastic threaded insert designed with a "break-away" feature.

FIG. 4 illustrates a metal threaded insert 327 designed with a "break-away" feature 329. The break-away feature may comprise one or more notches cut into the base of the plastic part so that the plastic encased metal boss may be easily fractured and removed, and the remainder of the part can be recycled.

Figure 5:
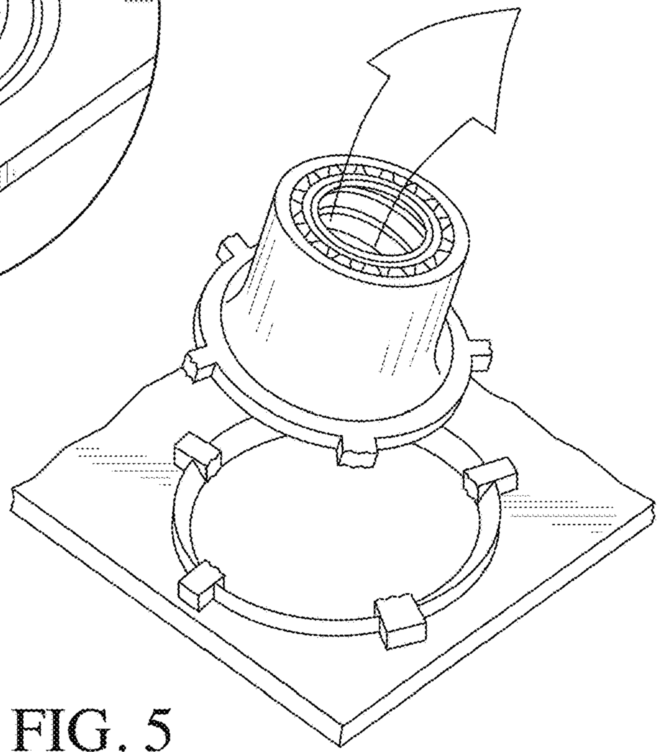
FIG. 5 demonstrates the plastic threaded insert of FIG. 4 being removed at its weak points.

FIG. 5 demonstrates the metal threaded insert of FIG. 4 being removed in the direction of the block arrow fracturing the "break-away" feature at its weak points.

Figure 6:
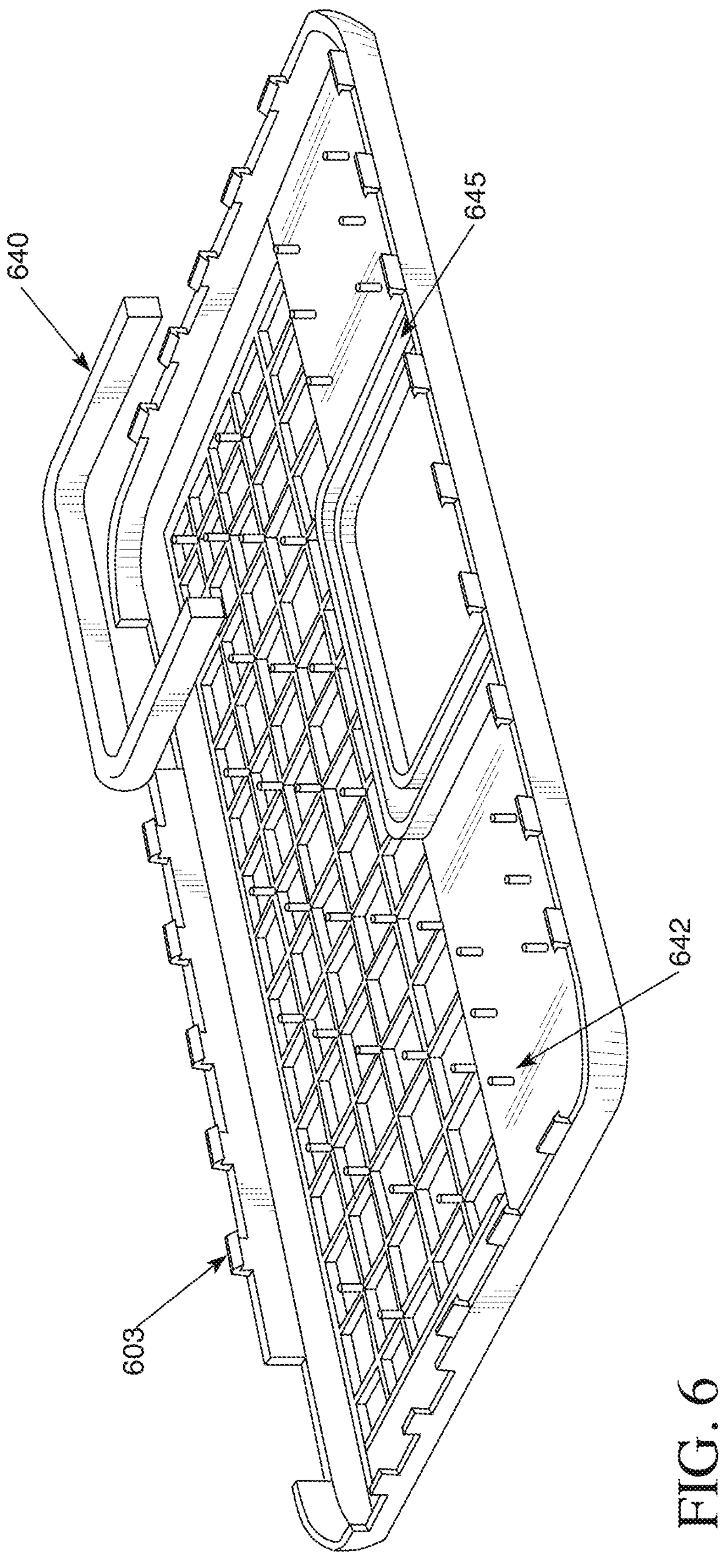
FIG. 6 shows the underside of the plastic "C" cover with a foam pad for tolerance take up.

FIG. 6 shows the underside of the plastic "C" cover with a foam pad 640 for tolerance take up. Snap fittings 603 are shown as are heat stakes 642 for affixing the keyboard to the "C" cover. Molded in groove 645 holds foam pad 640 in place eliminating an adhesive layer.

FIG. 7 provides an exploded view of the plastic "D" cover assembly of FIG. 1. Vent mesh 750 and electromagnetic interference (EMI) shielding material 752 are attached to the plastic "D" cover by a plurality of heat stakes 754. The replacement of adhesives by heat staking permits easier disassembly, and recycling yield. Conventional metal screws 756 may be used in much smaller numbers than in other laptops. One or more press-in rubber feet 760 are inserted in slots 759 of the plastic "D" cover allowing the replacement of adhesives while also permitting their easy removal during recycling of the laptop computer. Electromagnetic interference (EMI) shielding material 752 includes metals, conducting plastics and conducting polymers. Such materials are commercially available as films, foils, tapes, and sheets, and are described, e.g., in U.S. Pat. Nos. 9,167,735; 9,505,903; 8,722,186; 8,691,393; and 8,222,321.

Figure 8:
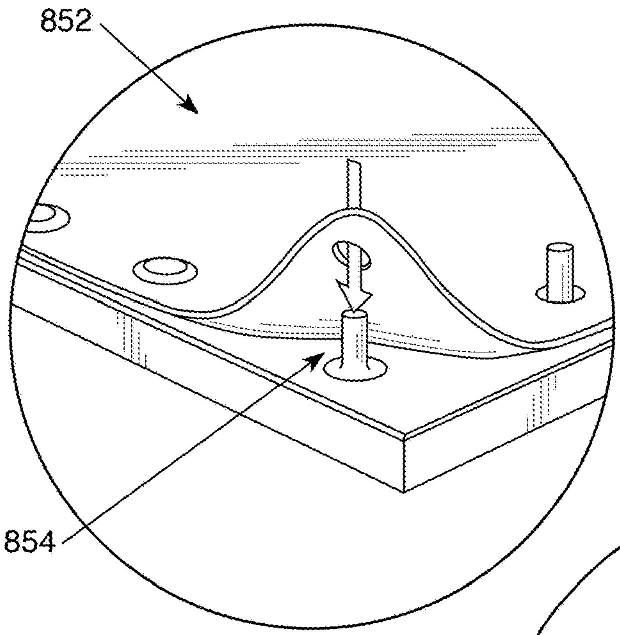
FIG. 8 is a closer view of the replacement of adhesives by attaching the electromagnetic interference (EMI) shielding material to the plastic "D" cover with heat stakes.

FIG. 8 is a closer view of the replacement of adhesives by attaching the electromagnetic interference (EMI) shielding material 852 to the "D" cover with heat stakes 854.

Figure 9:
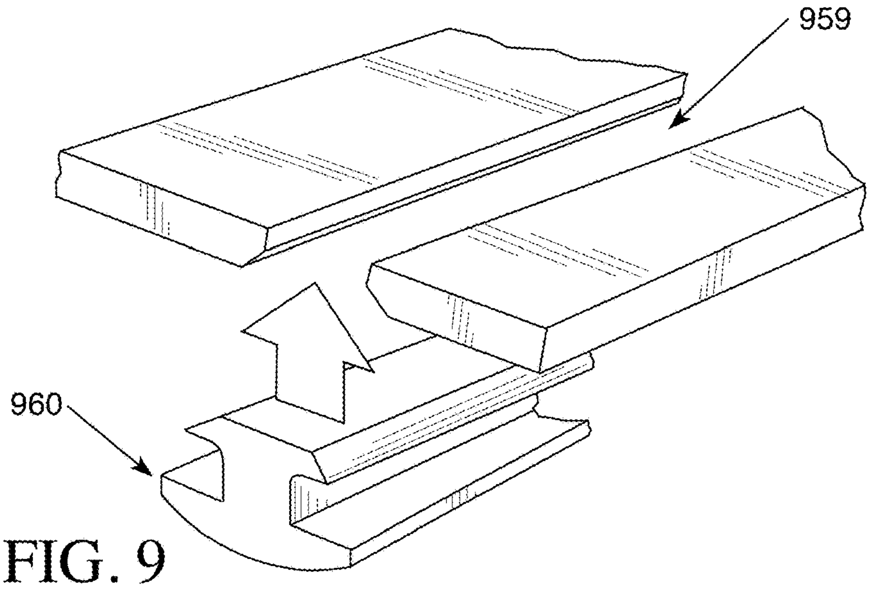
FIG. 9 demonstrates press-in rubber feet inserted in a slot of the plastic "D" cover.

FIG. 9 demonstrates press-in rubber feet 960 inserted in slot 959 in the direction of the wide arrow in the plastic "D" cover.

Figure 10:
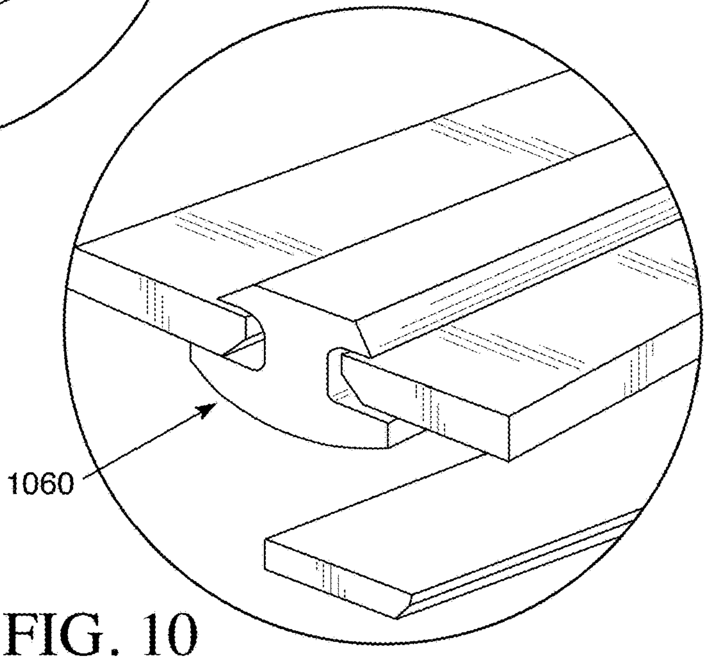
FIG. 10 depicts replacement of adhesives with press-in rubber feet.

FIG. 10 depicts replacement of adhesives with press-in rubber feet 1060.

As those skilled in the art are aware, various processes exist for recycling plastic materials, such as polycarbonates. In the present case, the processes may involve disassembling the housing, removing any non-plastic parts (such as the display panel, electromagnetic interference (EMI) shielding material, metal screws, etc.), mechanically shredding the housing, at least one of cleaning, sanitizing, and sorting the housing followed by the addition of heat (pyrolysis), and/or by the addition of chemical agents (chemolysis) to obtain a product, repelletizing and including the product in a polymer production process as a feedstock.

This specification has been written with reference to various non-limiting and non-exhaustive embodiments. However, it will be recognized by persons having ordinary skill in the art that various substitutions, modifications, or combinations of any of the disclosed embodiments (or portions thereof) may be made within the scope of this specification. Thus, it is contemplated and understood that this specification supports additional embodiments not expressly set forth herein. Such embodiments may be obtained, for example, by combining, modifying, or reorganizing any of the disclosed steps, components, elements, features, aspects, characteristics, limitations, and the like, of the various non-limiting embodiments described in this specification. In this manner, Applicant reserves the right to amend the claims during prosecution to add features as variously described in this specification, and such amendments comply with the requirements of 35 U.S.C. § 112(a), and 35 U.S.C. § 132(a).

Various aspects of the subject matter described herein are set out in the following numbered clauses:

In a first aspect, the invention is directed to a clamshell housing for a human-machine interface (HMI) comprising a plastic "C" cover assembly and a plastic "D" cover assembly, the "C" cover assembly comprising a plastic keyboard cover or palm rest, 202 having a plurality of snap fittings 203 thereon for attachment to a plastic "D" cover assembly, a keyboard 204 having a keyboard connector 222 electrically connecting the key board to a printed circuit board (PCB) 220, a trackpad 206 having a trackpad connector 224 electrically connecting the trackpad to the printed circuit board (PCB) 220, wherein the key board 204 and the trackpad 206 are each attached to the plastic "C" cover assembly and attached through a stamped metal plate 226 to the printed circuit board (PCB) 220 with a plurality of preformed plastic heat stakes 232, wherein a minimal plastic surround 210 is mounted beneath the stamped metal plate 226 onto the plurality of preformed plastic heat stakes 232, wherein the printed circuit board (PCB) 220 is attached at a plurality of plastic threaded inserts 227 to the minimal plastic surround 210 with one or more plastic "Christmas tree" fasteners 235; and wherein a plastic spring 233 is formed in the minimal plastic surround 210 to hold the trackpad 206 in tension, and wherein the plastic "C" cover assembly is attached through a plurality of metal screws 256 to the plastic "D" cover assembly; and the "D" cover comprising a vent mesh 750 attached to the plastic "D" cover assembly by a plurality of metal screws 756, an electromagnetic interference (EMI) shielding material 752 attached to the plastic "D" cover assembly by a plurality of preformed plastic heat stakes 754, a power source (e.g., battery) 753, and a plurality of press-in rubber feet 760 inserted into slots 759 of the plastic "D" cover assembly.

In a second aspect, the invention is directed to the clamshell housing according to the previous paragraph further including one or more electronic devices pinned to the stamped metal plate 226 with a plastic "Christmas tree" fastener 230.

In a third aspect, the invention is directed to the clamshell housing according to the previous paragraph, wherein the one or more electronic devices rest on foam 230 for vibration reduction.

In a fourth aspect, the invention is directed to the clamshell housing according to any one of the previous three paragraphs, wherein the minimal plastic surround 210 has a plastic spring 233 formed therein.

In a fifth aspect, the invention is directed to the clamshell housing according to any one of the previous four paragraphs, wherein the plastic is polycarbonate.

In a sixth aspect, the invention is directed to the clamshell housing according to the previous paragraph, wherein the polycarbonate is homopolycarbonate.

In a seventh aspect, the invention is directed to the clamshell housing according to any one of the previous six paragraphs, wherein the plastic keyboard cover 202 has a molded in groove 645 formed in its underside which is sized and shaped to hold a foam pad 640 in place.

In an eighth aspect, the invention is directed to the clamshell housing according to any one of the previous seven paragraphs, wherein the plastic keyboard cover 202 has a plurality of preformed heat stakes 642 on its underside.

In a ninth aspect, the invention is directed to the clamshell housing according to any one of the previous two paragraphs, wherein the polycarbonate contains a filler selected from the group consisting of glass fibers, carbon fibers, cellulosics, graphite, graphene, carbon nanotubes, chalk, quartz powder, titanium dioxide, silicates, talc, wollastonite, montmorillonite, kaolin, zeolite, vermiculite, aluminium oxide, silica, and mixtures of these.

In a tenth aspect, the invention is directed to the clamshell housing according to any one of the previous nine paragraphs, wherein the electromagnetic interference (EMI) shielding material 752 is selected from the group consisting of metals, conducting plastics, and conducting polymers.

In an eleventh aspect, the invention is directed to the clamshell housing according to any one of Clauses 1 to 10, wherein the human-machine interface (HMI) is included in one selected from the group consisting of a laptop computer, a tablet computer, a notebook computer, a desktop computer, a television, a gaming device, an advertising display, a power source (e.g., battery), a monitor, a camera, a server, an access control, point of sale equipment, an e-reader, a projector, a thermostat, a home automation portal, a kitchen appliance, an automotive part, a healthcare device, a surgical device, a smart hub, a mobile phone, a GPS receiver, a transceiver, a remote control, a head lamp, control electronics, a router-WLAN or LAN, a wired or wireless access point, and an electrical power source.

In a twelfth aspect, the invention is directed to a process of recycling the clamshell housing according to any one of the previous eleven paragraphs, the process comprising disassembling the clamshell housing, removing any non-plastic parts, mechanically shredding the clamshell housing, at least one of cleaning, sanitizing, sorting the clamshell housing, subjecting the clamshell housing to at least one of pyrolysis and chemolysis to obtain a product, repelletizing the product, and including the product in a polymer production process as a feedstock.

What is claimed is:

1. A clamshell housing for a human-machine interface (HMI) comprising a plastic "C" cover assembly and a plastic "D" cover assembly, a plastic "C" cover assembly comprising a plastic keyboard cover or palm rest, (202) having a plurality of snap fittings (203) thereon for attachment to a plastic "D" cover assembly, a keyboard (204) having a keyboard connector (222) electrically connecting the keyboard to a printed circuit board (PCB) (220), a trackpad (206) having a trackpad connector (224) electrically connecting the trackpad to the printed circuit board (PCB) (220), wherein the keyboard (204) and the trackpad (206) are each attached to the plastic "C" cover assembly and attached through a stamped metal plate (226) to the printed circuit board (PCB) (220) with a plurality of preformed plastic heat stakes (232), wherein a minimal plastic surround (210) is mounted beneath the stamped metal plate (226) onto the plurality of preformed plastic heat stakes (232), wherein the printed circuit board (PCB) (220) is attached at a plurality of plastic threaded inserts (227) to the minimal plastic surround (210) with a plurality of plastic "Christmas tree" fasteners (235); and wherein a plastic spring (233) is formed in the minimal plastic surround (210) to hold the trackpad (206) in tension, and wherein the plastic "C" cover assembly is attached through a plurality of metal screws (256) to the plastic "D" cover assembly; and the plastic "D" cover assembly comprising a vent mesh (750) attached to the plastic "D" cover by the plurality of metal screws (756), an electromagnetic interference (EMI) shielding material (752) attached to the plastic "D" cover assembly by a plurality of preformed plastic heat stakes (754), a power source (753), and a plurality of press-in rubber feet (760) inserted into slots (759) of the plastic "D" cover assembly.

2. The clamshell housing according to claim 1 further including one or more electronic devices pinned to the stamped metal plate (226) with a plastic “Christmas tree” fastener (230).

3. The clamshell housing according to claim 2, wherein the one or more electronic devices rest on foam (230) for vibration reduction.

4. The clamshell housing according to claim 1, wherein the minimal plastic surround (210) has a plastic spring (233) formed therein.

5. The clamshell housing according to claim 1, wherein the plastic comprises a thermoplastic.

6. The clamshell housing according to claim 5, wherein the thermoplastic comprises polycarbonate.

7. The clamshell housing according to claim 6, wherein the polycarbonate is homopolycarbonate.

8. The clamshell housing according to claim 6, wherein the polycarbonate contains a filler selected from the group consisting of glass fibers, carbon fibers, cellulosics, graphite, graphene, carbon nanotubes, chalk, quartz powder, titanium dioxide, silicates, talc, wollastonite, montmorillonite, kaolin, zeolite, vermiculite, aluminium oxide, silica, and mixtures of these.

9. The clamshell housing according to claim 1, wherein the plastic keyboard cover (202) has a molded in groove (645) formed in its underside which is sized and shaped to hold a foam pad (640) in place.

10. The clamshell housing according to claim 1, wherein the plastic keyboard cover (202) has a plurality of preformed heat stakes (642) on its underside.

11. The clamshell housing according to claim 1, wherein the electromagnetic interference (EMI) shielding material (752) is selected from the group consisting of metals, conducting plastics, and conducting polymers.

12. The clamshell housing according to claim 1, wherein the human-machine interface (HMI) is included in one selected from the group consisting of a laptop computer, a tablet computer, a notebook computer, a desktop computer, a television, a gaming device, an advertising display, a battery, a monitor, a camera, a server, an access control, point of sale equipment, an e-reader, a projector, a thermostat, a home automation portal, a kitchen appliance, an automotive part, a healthcare device, a surgical device, a smart hub, a mobile phone, a GPS receiver, a transceiver, a remote control, a head lamp, control electronics, a router-WLAN or LAN, a wired or wireless access point, and an electrical power source.

13. A process of recycling the clamshell housing according to claim 1, the process comprising disassembling the clamshell housing, removing any non-plastic parts, mechanically shredding the clamshell housing, at least one of cleaning, sanitizing, sorting the clamshell housing, subjecting the clamshell housing to at least one of pyrolysis and chemolysis to obtain a product, repelletizing the product, and including the product in a polymer production process as a feedstock.

* * * * *